US006347850B1

(12) United States Patent
Volk

(10) Patent No.: US 6,347,850 B1
(45) Date of Patent: Feb. 19, 2002

(54) PROGRAMMABLE BUFFER CIRCUIT

(75) Inventor: Andrew M. Volk, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/472,373

(22) Filed: Dec. 23, 1999

(51) Int. Cl.$^7$ .......................................... H03K 19/0175
(52) U.S. Cl. ............................ 328/82; 326/30; 326/87
(58) Field of Search ............................ 326/27, 30, 83, 326/86, 87

(56) References Cited

U.S. PATENT DOCUMENTS

| | | | | |
|---|---|---|---|---|
| 5,134,311 A | * | 7/1992 | Biber et al. ............... | 326/30 |
| 5,254,883 A | * | 10/1993 | Horowitz et al. .......... | 326/87 |
| 5,457,407 A | * | 10/1995 | Shu et al. ................. | 326/30 |
| 5,955,894 A | * | 9/1999 | Vishwanthaiah et al. .... | 326/30 |
| 6,118,310 A | * | 9/2000 | Esch, Jr. ................... | 326/30 |
| 6,166,563 A | * | 12/2000 | Volk et al. ................ | 326/30 |

OTHER PUBLICATIONS

DeHon et al., "Automatic Impedance Control" IEEE International Solid–State Circuits Conference, 164–165, 1993.
Gabra and Knauer, "Digitally Adjustable Resistors in CMOS for High–Performance Applications", IEEE Journal of Solid State Circuits, 27:1176–1185, 1992.

Knight, "A Self–Terminating Low–Voltage Swing CMOS Output Driver", IEEE Journal of Solid–State Circuits; 23: 457–464, 1988.

Kushiyama et al., "A 500–Megabyte/s Data–Rate 4.5M DRAM", IEEE Journal of Solid–State Circuits, 28:490–498, 1993.

Pilo et al., "A 300 MHz, 3.3v 1Mb SRAM Fabricated in a 0.5Tm CMOS Process", IEEE International Solid–State Circuits Conference, pp. 148–149, 1996.

Takahashi et al., "A CMOS Gate Array with 600Mb/s Simultaneous Bidirectional I/O Circuits" IEEE International Solid–State Circuits Conference, pp. 40–41, 1995.

Trotter, et al., "A CMOS Low Voltage High Performance Interface", IEEE, pp 44–48.

* cited by examiner

Primary Examiner—Michael Tokar
Assistant Examiner—Don Phu Le
(74) Attorney, Agent, or Firm—Fish & Richardson P.C.

(57) ABSTRACT

A first buffer impedance value is established by electronically adjusting a first impedance between a first voltage source and a first reference point until the potential at the first reference point has a predetermined relationship to a reference voltage. A second buffer impedance value is established by adjusting the impedance between a second reference point and a second voltage source, until the potential at the second reference point has a predetermined relationship with the reference voltage.

20 Claims, 5 Drawing Sheets

PROGRAMMABLE BUFFER CIRCUIT

BACKGROUND

This invention relates to programming data buffer output characteristics.

A data buffer is a digital electronic circuit for holding a binary value (e.g. 0 or 1), and communicating it to other circuits to which it is connected. The binary value is represented by a voltage level. It is common to connect a data buffer to a data bus which connects the output of the buffer to a receiving circuit.

It is common for multiple output buffers to be connected to a single data bus. To prevent such buffers from interfering with each other, it is common to construct all data buffers used with a given bus according to a bus protocol. A bus protocol specifies the signaling sense (whether 0 equals LOW and 1 equals HIGH or vice versa), the impedance of the buffer when it is not driving (whether it is high impedance or terminating impedance), the impedance of the buffer when it is driving, and the signal voltage swing. The signal voltage swing is the distance (in volts) between the HIGH voltage level and the LOW voltage level.

In a series-terminated bus protocol, the buffer is set to a high impedance when it is not driving. When the buffer is driving, the HIGH and LOW values are the respective rail voltages (e.g., Vcc and ground), and the impedance is set to be a specified output impedance.

In a typical parallel-terminated bus protocol, one output state (either HIGH or LOW) is equal to one of the rail voltages, while the other state is defined as being a certain distance (in volts, or "swing"), away from that voltage. A parallel-terminated protocol in which Vcc specifies one of the output states is called "Vcc referenced" while a parallel-terminated protocol in which ground specifies one of the output states is called "ground referenced" or "Vss referenced." The output impedances of the HIGH and LOW states are not necessarily the same. When the parallel buffer is not driving, its output voltage and output impedance are the same as when it is driving at the rail voltage used to define one of the output states.

SUMMARY

In general, in one aspect, a method for establishing buffer impedance values includes establishing a first buffer impedance value by electronically adjusting a first impedance between a first voltage source and a first reference point until the potential at the first reference point has a predetermined relationship to a reference voltage and establishing a second buffer impedance value by adjusting the impedance between the second reference point and a second voltage source, until the potential at the second reference point has a predetermined relationship with the reference voltage.

In general, in another aspect, an electronic circuit includes a first impedance programmable device connected between a first voltage source and a first reference point and a second impedance programmable device connected between a second voltage source and a second reference point. A control logic in the circuit establishes a first buffer impedance value by adjusting the impedance of the first impedance programmable device until the potential at the first reference point has a predetermined relationship with a reference voltage and establishes a second buffer impedance value by adjusting the impedance of the second impedance programmable device until the potential at the second reference point has a predetermined relationship with the reference voltage.

Embodiments of the invention may have one or more of the following advantages. One buffer may be used for multiple bus protocols without significant additional overhead circuitry. Within the allowed buffer strength range, the buffer characteristics can be set by a single resistor and reference voltage source. Buffer characteristics can be programmed at any time. Buffer characteristics can be programmed in real time.

Other advantages and features will become apparent from the following description and from the claims.

DESCRIPTION

Figure 1:
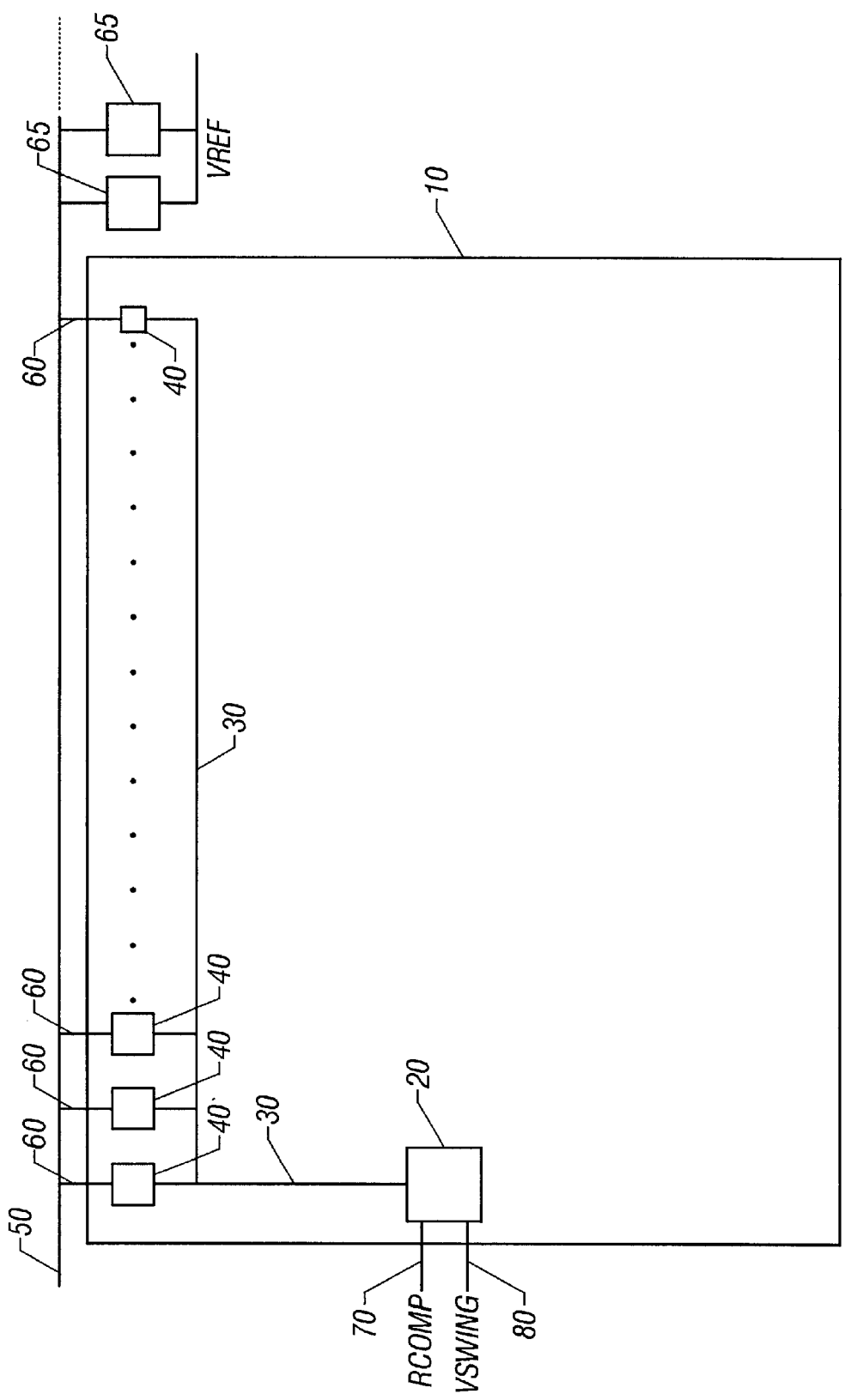
FIG. 1 shows a schematic drawing of an embodiment.

FIG. 1 is a simplified diagram of an embodiment. Programmable buffer circuit 10 has impedance programmable buffers 40 which are each connected to bus line 50 through outputs 60. Other circuits 65 are also connected to bus line 50 which are capable of receiving signals from programmable buffers 40 or which have buffers for transmitting signals over bus line 50. Circuits 65 receive reference voltage Vref, for use as an input switching level reference.

Programmable buffer circuit 10 also includes buffer impedance control circuit 20, which is electronically connected to each of the buffers 40 via multi-bit impedance control line 30. Impedance compensation control circuit 20 has programming pads RCOMP 70 and VSWING 80.

Figure 2:
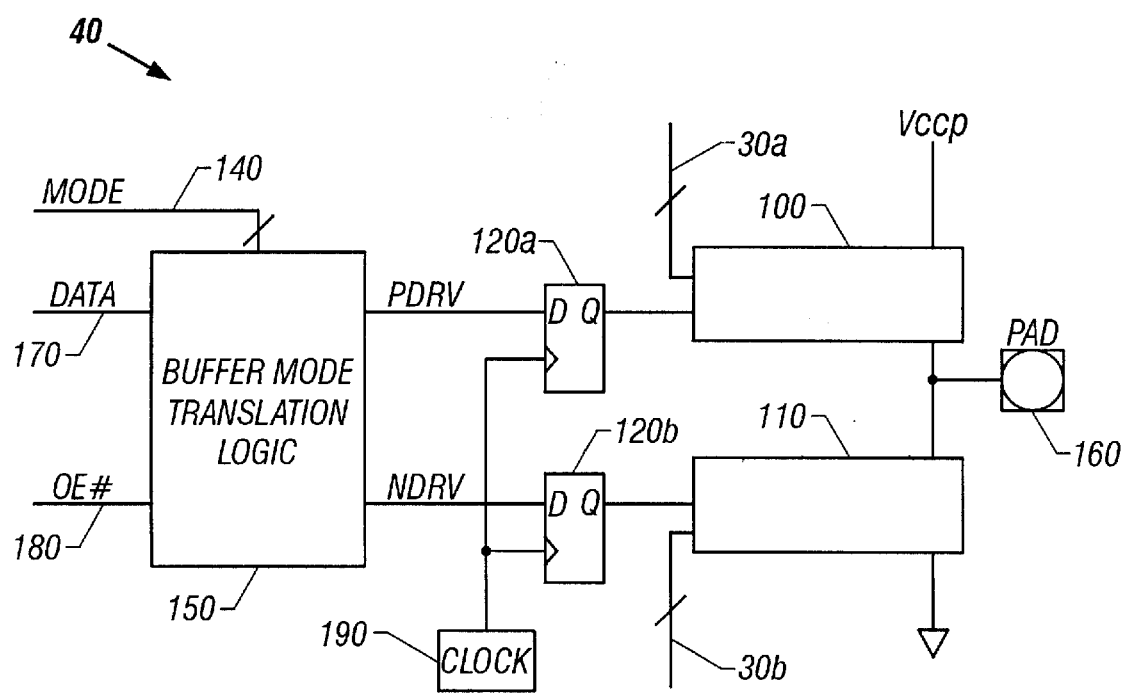
FIG. 2 shows a schematic diagram of a programmable buffer.

FIG. 2 is a simplified diagram of a programmable buffer 40. Buffer 40 includes programmable pull-up 100 which is connected between voltage source Vccp and output pad 160. Programmable pull-down 110 is connected between output pad 160 and ground. Programmable pull-up 100 and programmable pull-down 110 each receive as inputs the outputs of latches 120a and 120b respectively. Programmable pull-up 100 and programmable pull-down 110 each receive half of the bit lines from multi-bit impedance control line 30, indicated as lines 30a and 30b.

Programmable pull-up 100 is a switchable circuit that provides a programmable impedance between Vccp and output pad 160 when it is activated by the output of latch 120a going into a LOW state. When the output of latch 120a is HIGH, programmable pull-up 100 is turned off and there is no connection between Vccp and output pad 160. The amount of impedance provided by programmable pull-up 100 is controlled by the value on multi-bit impedance control line 30a.

Similarly, programmable pull-down 110 is a switchable circuit that provides a programmable impedance between ground and output pad 160 when it is activated by the output of latch 120b going into a HIGH state. When the output of latch 120b is LOW, programmable pull-down 110 is turned off and there is no connection between ground and output pad 160.

Latches 120 receive data input from lines PDRV and NDRV respectively, which are outputs of buffer mode translation logic 150. Each latch is clocked by a clock signal from clock 190.

Buffer mode translation logic 150 receives input from data line 170 and output enable (OE#) line 180. Buffer mode translation logic 150 also receives input from one or more bits on mode line 140.

Buffer mode translation logic 150 generates outputs PDRV and NDRV according to a bus protocol specified by the value of mode line 140. By way of example, mode line 140 may have values of 0, 1, or 2, corresponding respectively to a positive logic, rail-to-rail swing series-terminated protocol (such as the AGP-4X protocol, described in *Accelerated Graphics Port Interface Specification*, published by Intel Corporation on May 4, 1998 and available at http://www.intel.com/technology/agp/agp_index.htm); a negative logic, Vccp referenced, ⅔ of supply swing, parallel-terminated protocol (such as the GTL protocol, described in *Pentium II Processor Developer's Manual*, published by Intel Corporation, October 1997, and available at http://developer.intel.com/design/pentiumii/manuals/243502.htm), and a positive logic, ground referenced, fixed swing parallel-terminated protocol.

The following table shows the output states of PDRV and NDRV for given input values of MODE, DATA and OE#, and the resulting states at the output pad 160.

TABLE 1

Buffer Mode Translation Logic

| Mode | Data | OE # | PDRV | NDRV | OUTPUT |
|---|---|---|---|---|---|
| 0 (AGP-4X) | X | 1 | 1 | 0 | high impedance |
| 0 (AGP-4X) | 0 | 0 | 1 | 1 | LOW |
| 0 (AGP-4X) | 1 | 0 | 0 | 0 | HIGH |
| 1 (GTL) | X | 1 | 0 | 0 | HIGH |
| 1 (GTL) | 0 | 0 | 0 | 0 | HIGH |
| 1 (GTL) | 1 | 0 | 1 | 1 | LOW |
| 2 (Parallel-Terminated - Vss Ref) | X | 1 | 1 | 1 | LOW |
| 2 (Parallel-Terminated - Vss Ref) | 0 | 0 | 1 | 1 | LOW |
| 2 (Parallel-Terminated - Vss Ref) | 1 | 0 | 0 | 0 | HIGH |

Figure 3:
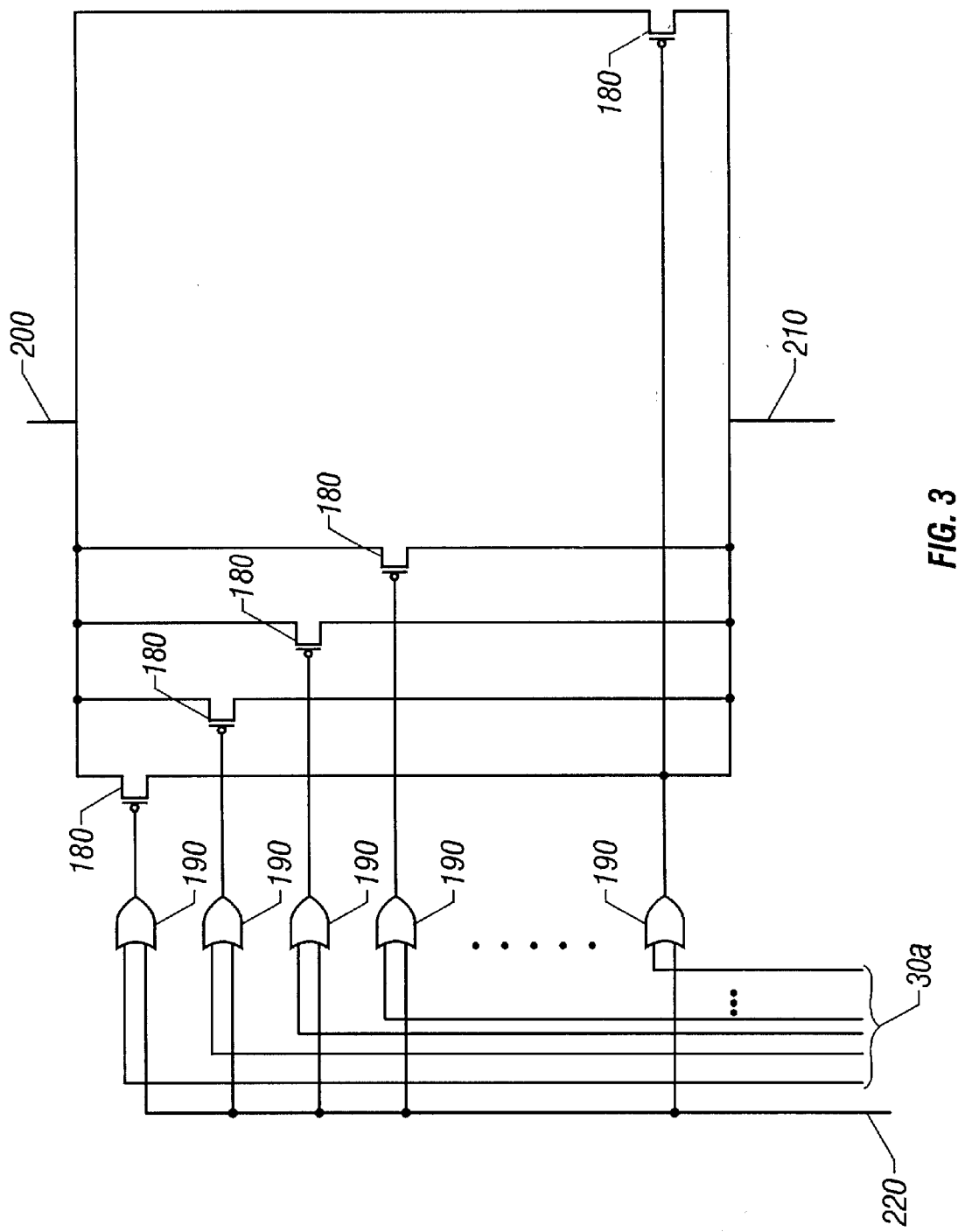
FIG. 3 shows a schematic diagram of a programmable pull-up device.

FIG. 3 is a simplified diagram of a programmable pull-up 100. A set of p-channel MOSFETs 180 are arrayed in parallel between terminals 200 and 210. The number and values of the MOSFETs that are turned on when the pull-up 100 is enabled determines the impedance between terminals 200 and 210. In a preferred embodiment, the MOSFETs 180 are sized in a binary progression to allow a wide range of impedance programming (e.g. between 25 and 100 ohms) and with a sufficient number to get a sufficiently small granularity (e.g. about 1.5 ohms). Terminal 200 is connected to Vccp, and terminal 210 is connected to output pad 160.

The gate of each MOSFET 180 is driven by the output of one of a set of corresponding OR gates 190. Each OR gate 190 receives as one input a one bit data line 220, which is connected to the output of latch 120 (as shown in FIG. 2), and one bit from multi-bit control line 30a.

As can be seen, when the value of data line 220 is HIGH, the output of each OR gate 190 is HIGH, and each MOSFET 180 is turned off. When the value of data line 220 is LOW, the state of each MOSFET 180 depends on the state of the corresponding bit in control line 30a. If the bit is HIGH, the corresponding MOSFET is turned off. If the bit is low, the corresponding MOSFET is turned on. Thus, the value on control line 30a determines the impedance between terminals 200 and 210 when data line 220 is LOW.

The structure of programmable pull-down 110 is the same as the structure of programmable pull-up 100 except that the MOSFETs in the programmable pull-down are n-channel devices, and the logic gates are AND gates rather than OR gates. When the data line of pull-down 110 is HIGH, the impedance between the terminals is determined by the value on multi-bit control line 30b.

Figure 4:
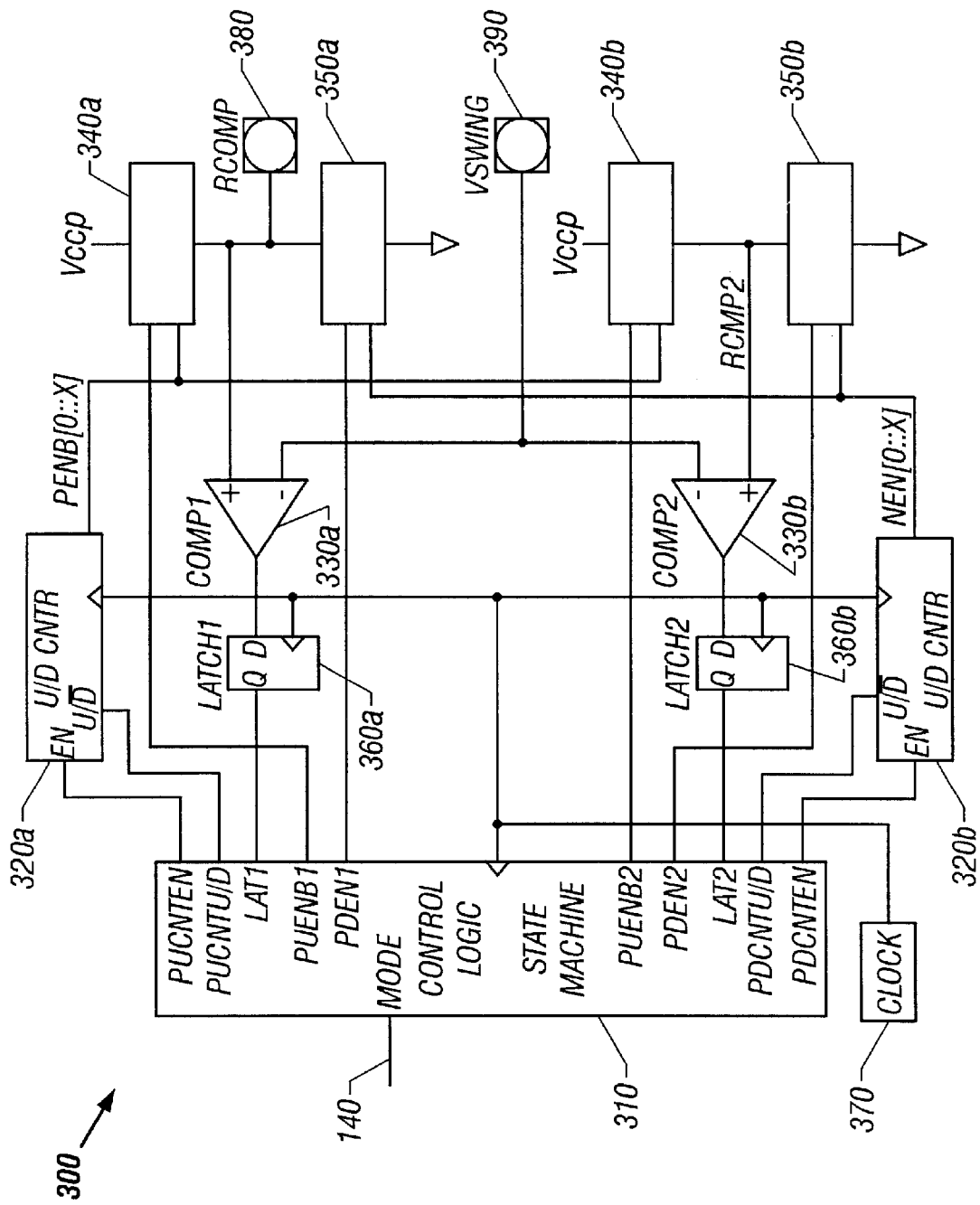
FIG. 4 shows a schematic diagram of an impedance compensation control circuit.

FIG. 4 is a schematic diagram of a general impedance compensation control circuit 300 having a control logic 310, counters 320a and 320b, comparators 330a and 330b, programmable pull-ups 340a and 340b, programmable pull-downs 350a and 350b, latches 360a and 360b, clock 370 and programming pads RCOMP 380 and VSWING 390. The programmable pull-ups 340 and programmable pull-downs 350 are identical to the pull-ups 100 and pull-downs 110 in the programmable buffers 40, as shown in FIG. 2.

Counters 320 are connected to the control logic 310 by control lines which enable control logic to activate and deactivate counters 310 and to determine the direction in which they count. Counters 320 are also connected to clock 370 from which they receive clocking signals. Counters 320 are designed to prevent rollover conditions. That is, an attempt to count below 0 or above the highest possible value will leave the count at 0 or that highest value, as the case may be.

The multi-bit output of counter 320a is connected to the multi-bit control line inputs of programmable pull-ups 340, and the multi-bit output of counter 320b is connected to the multi-bit control line inputs of programmable pull-downs 350.

Programmable pull-up 340a has one of its terminals connected to Vccp and another connected to programming pad RCOMP 380. Programmable pull-down 350a has one terminal connected to programming pad RCOMP 380 and one terminal connected to ground. Programmable pull-up 340b has one of its terminals connected to Vccp, and another connected to reference point RCMP2. Programmable pull-down 350b has one of its terminals connected to reference point RCMP2 and the other terminal connected to ground.

The positive and negative inputs of comparator 330a are connected to programming pads RCOMP 380 and VSWING 390, respectively. The positive and negative inputs of comparator 330b are connected to reference point RCMP2 and programming pad VSWING 390, respectively.

The output of comparators 330a and 330b are connected to the data inputs of latches 360a and 360b respectively. Latches 360 also receive a clock input from clock 370. The output of each latch 360 is connected to control logic 310. Control logic 310 is also connected to receive multi-bit mode line 140.

The operation of programmable buffer circuit 10 will now be described. Programmable buffer circuit 10 is programmed by setting the value of the multi-bit mode line 140 to specify a particular bus protocol, by connecting programming pad RCOMP 380 to a resistor having a particular value between RCOMP and one of the voltage sources (i.e. Vccp or ground), and by connecting programming pad VSWING 390 to a particular reference voltage.

The value of mode line 140 may be set by any conventional method, such as by use of DIP switches, fusable links, a configuration register, or from an external circuit (such as a microprocessor). As noted above, the buffer mode translation logic 150 in each programmable buffer 40 uses the value of the mode line to determine the appropriate output logic values to generate when the buffer is driving data 0 or data 1 and when it is not driving.

The voltage applied to VSWING is selected so as to define the voltage swing across the terminating devices. For Vccp-referenced parallel-terminated protocols, VSWING is set to the VOL level. Conversely, for Vss-referenced parallel-terminated protocols, VSWING is set to the VOH level. For a series-terminated protocol, VSWING is set to the voltage point that defines the output transistor impedance or equivalent drive level. This is often set to the input switching level voltage for the interface (Vref).

The resistor connected to RCOMP is connected between RCOMP and the opposite rail from the one to which the terminating pull-up or pull-down devices are connected. In the case of a Vccp-referenced parallel-terminated protocol, the resistance is connected between RCOMP and ground. In the case of a ground-referenced parallel-terminated protocol, the resistance is connected between RCOMP and Vccp. In the case of a series-terminated protocol, the resistor may be connected to either voltage source, and the choice may be made on best accuracy or matching characteristics. By way of example, the following illustration shows the resistor being connected between RCOMP and ground for a series-terminated protocol.

The value of the resistor connected to RCOMP is determined so that the voltage at RCOMP is equal to VSWING when the impedance of the terminating device is the desired value. The general equation for the resistance R of the resistor is given as follows:

$$R = Zterm*(Vccp/Vterm - 1),$$

where Zterm is the desired termination impedance (as defined by the desired bus protocol), and Vterm is the distance between the VSWING voltage and the voltage at the rail to which the terminating device is attached.

Figure 5:
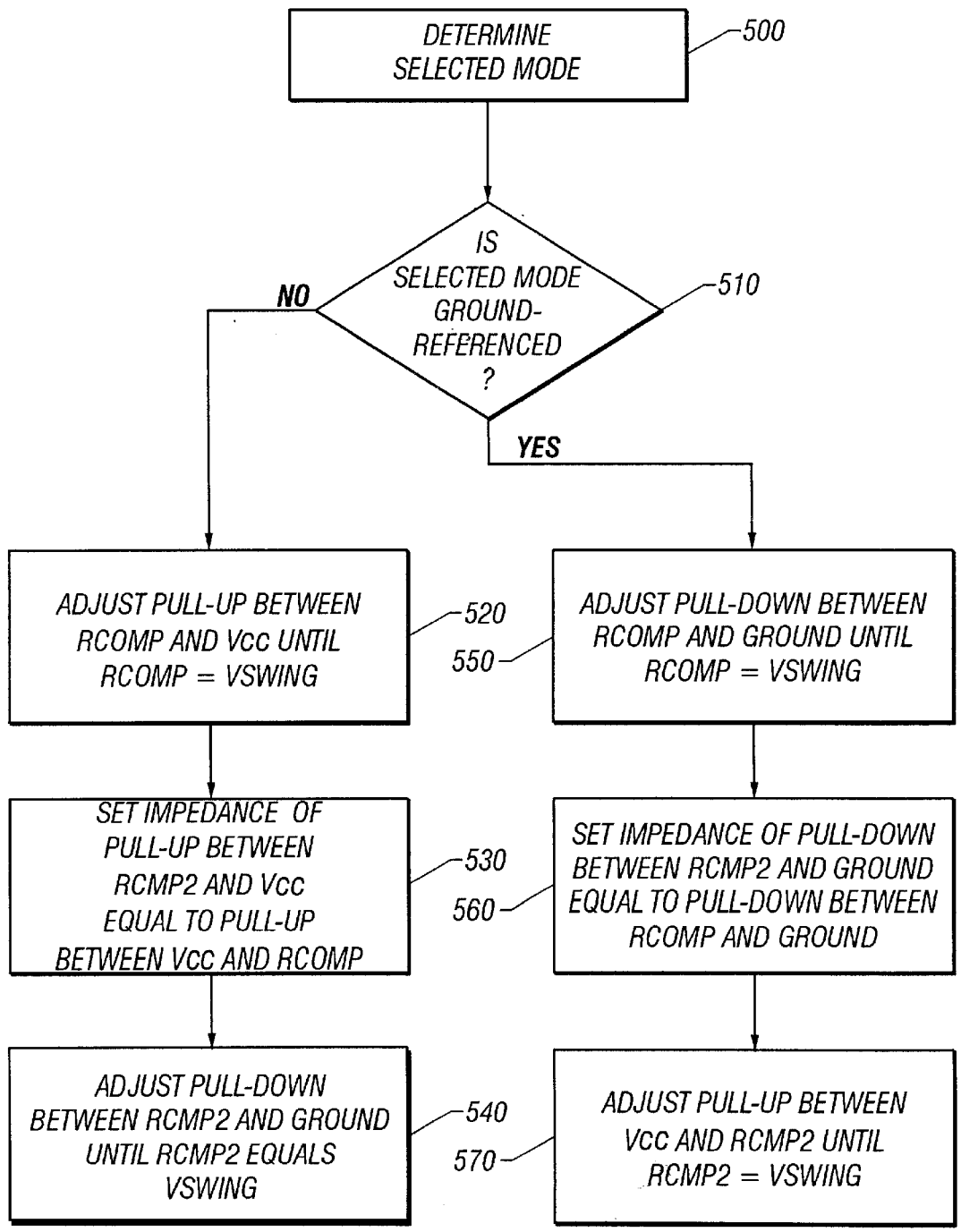
FIG. 5 is a flowchart showing the steps taken to establish impedance values in the impedance compensation control circuit.

Referring now to FIGS. 4 and 5, the control logic sets the impedance control values as follows. First, the selected mode is determined (step 500). If the selected mode does not refer to a ground referenced protocol (or is a series-terminated protocol) (step 510), then the control logic 310 enables programmable pull-up 340a and causes counter 320a to increment through a range of values for programming the impedance of the enabled pull-up.

After each increment in the counter value, comparator 330a compares the voltage at programming pad RCOMP 380 with the voltage at programming pad VSWING 390, and the output of the comparator is latched in latch 360a.

Control logic causes counter 320a to continue to increment its value until the voltage at RCOMP equals the voltage at VSWING. (In practice, this may be done, for example, by incrementing the value of the counter until the output of comparator 330a changes sign and then decrementing the value of the counter by 1.) (step 520).

After the voltages at RCOMP and VSWING have been equalized, the control logic 310 enables programmable pull-up 340b and programmable pull-down 350b. The pre-existing value in counter 320a now causes the impedance of pull-up 340b to be equal to that of pull-up 340a (step 530).

Next, the control logic enables counter 320b and causes it to increment through a range of values corresponding to impedances of pull-down 350b. This process continues until the voltage at RCMP2 equals VSWING (step 540).

In the event that the selected mode indicates a ground-referenced protocol, the following steps are taken instead. Pull-down 350a is enabled, and counter 320b is incremented until the voltage at RCOMP equals VSWING (step 550).

Then, pull-up 340b and pull-down 350b are activated and the value in counter 320b programs the impedance of pull-down 350b (step 560).

Finally, counter 320a is incremented to adjust the impedance of pull-up 340b until the voltage at RCMP2 equals VSWING (step 570).

By this process, the appropriate impedance values for programmable pull-ups 100 and programmable pull-downs 110 are established. The first impedance value established is correct because the value of the RCOMP resistor was selected so that when the termination impedance was correctly set, the voltage would equal VSWING. The second impedance value established is correct because the protocol requires that the output voltage of the buffer equal VSWING when both the pull-up 100 and the pull-down 110 are enabled.

After the process of setting impedance values has been completed, the counter values of counters 320a and 320b are applied to the programmable pull-ups 100 and pull-downs 110 in each output buffer 40, thereby causing each output buffer to have the appropriate impedance and output voltages for the selected bus protocol.

The impedance setting process may be better understood by reference to the following examples. The AGP-4X protocol is a series-terminated protocol that uses positive logic, and has a termination impedance of 40 ohms at Vccp/2. Programmable buffer circuit 40 is programmed for the AGP-4X protocol by setting VSWING =Vccp/2 and by setting the RCOMP resistor equal to 40*((Vccp)/(Vccp/2)−1)=40.

The RCOMP resistor is tied to ground.

The control logic 310 of the impedance compensation control circuit 300 determines from the value of mode line 140 that the AGP-4X protocol is desired. It first enables pull-up 340a and begins incrementing counter 320a until the voltage at RCOMP equals the voltage at VSWING. Since VSWING equals Vccp/2, this will occur when the impedance of pull-up 340a equals the impedance of the RCOMP resistor, or 40 ohms. Then, pull-up 340b and pull-down 350b are enabled, and the impedance of pull-up 340b is set to 40 ohms. The control logic causes counter 320b to begin incrementing until the voltage at RCMP2 equals VSWING, which will occur when the impedance across pull-down 350b is equal to 40 ohms.

In another example, the GTL protocol is a negative logic, ⅔ of supply swing, parallel-terminated interface. The desired termination impedance is 60 ohms. Thus VSWING is set equal to Vccp/3 and the RCOMP resistor is set equal to 60*(Vccp/(Vccp*⅔)−1)=30 ohms. The RCOMP resistor is tied to ground.

The control logic 310 of the impedance compensation control circuit 300 determines from the value of mode line 140 that the GTL protocol is desired. It first enables pull-up 340a and begins incrementing counter 320a until the voltage at RCOMP equals the voltage at VSWING. Since VSWING equals Vccp/3, this will occur when the impedance of pull-up 340a equals twice the impedance of the RCOMP resistor, or 60 ohms. Then, pull-up 340b and pull-down 350b are enabled, and the impedance of pull-up 340b is set to 60 ohms. The control logic causes counter 320b to begin incrementing until the voltage at RCMP2 equals VSWING, which will occur when the impedance across pull-down 350b is equal to 30 ohms.

In another example, a parallel-terminated, ground-referenced positive logic protocol calls for a termination impedance of 60 ohms and a voltage swing of 0.7 volts. Thus, VSWING is set equal to 0.7 volts, and the RCOMP esistor is set equal to 60*((Vccp/0.7)−1). If Vccp is set, for example, at 1.8 volts, this would result in an COMP resistor value of about 94 ohms. Because the protocol is ground-referenced, the RCOMP resistor is tied between RCOMP and Vccp.

The control logic 310 of the impedance compensation control circuit 300 determines from the value of mode line 140 that the parallel-terminated ground-referenced positive logic protocol is desired. It first enables pull-down 350a and begins incrementing counter 320b until the voltage at RCOMP equals the voltage at VSWING. Since VSWING equals 0.7, this will occur when the impedance of pull-down 350a equals 60 ohms. Then, pull-up 340b and pull-down 350b are enabled, and the impedance of pull-down 350b is set to 60 ohms. The control logic causes counter 320a to begin incrementing until the voltage at RCMP2 equals VSWING, which will occur when the impedance across pull-up 340b is equal to about 94 ohms.

Accordingly, an apparatus and method are provided that permit a single circuit to be programmed to operate under a variety of bus protocols, without the need for significant additional overhead circuitry. In addition, the buffer characteristics can be set by a single resistor and voltage swing reference level. The protocol may therefore be programmed at any time. For example, the protocol may be programmed when the circuit is assembled, or in real time by using other circuits to alter the resistance applied to RCOMP and the reference voltage applied to VSWING.

The invention is not limited to the embodiments described above. Other embodiments are also within the scope of the following claims. For example, a preferred embodiment of the invention is formed as an integrated circuit with the pads VSWING and RCOMP being externals pads or pins. However, in an alternative embodiment, VSWING and RCOMP could represent connection points internal to an integrated circuit. An internal selection mechanism could allow the connection of a variable resistor to RCOMP and VSWING could be connected to one of several voltages generated from resistive (or device) dividers or from on-die voltage sources such as a bandgap voltage reference.

In another example, in a preferred embodiment of the invention the invention, programmable pull-ups 340 and programmable pull-downs 350 in the general impedance compensation control circuit are identical to programmable pull-ups 100 and pull-downs 110 in programmable buffers 40. However, in an alternative embodiment, the programmable pull-ups 340 and pull-downs 350 may differ from the pull-ups 100 and pull-downs 110 by having more switches (e.g. MOSFETs 180) with finer granularity. For example if pull-ups 340 and pull-downs 350 have two extra control bits as compared to pull-ups 100 and pull-downs 110, these bits can be used to round up or round down the value that is applied to the programmable pull-ups 100 and pull-downs 110.

What is claimed is:

1. A method for establishing buffer impedance values comprising:
    establishing a first buffer impedance value by automatically adjusting a first impedance between a first voltage source and a first reference point until the potential at the first reference point has a predetermined relationship to a reference voltage;
    adjusting an impedance between the first voltage source and a second reference point to a value based upon the first impedance; and
    establishing a second buffer impedance value by adjusting the impedance between the second reference point and a second voltage source, until the potential at the second reference point has a predetermined relationship with the reference voltage.

2. A method for establishing buffer impedance values comprising:
    establishing a first buffer impedance value by automatically adjusting a first impedance between a first voltage source and a first reference point until the potential at the first reference point has a predetermined relationship to a reference voltage;
    establishing a second buffer impedance value by adjusting the impedance between a second reference point and a second voltage source, until the potential at the second reference point has a predetermined relationship with the reference voltage; and
    adjusting the impedance between the first voltage source and a second reference point to equal the first impedance.

3. The method of claim 1, wherein adjusting the first impedance comprises selectively turning on different ones of a plurality of switching devices connected between the first voltage source and the first reference point.

4. The method of claim 3, wherein the selectively turning on further comprises moving the value of a first counter through a range of values, each values causing different ones of the plurality of switching devices to turn on.

5. The method of claim 4, wherein adjusting the impedance between the first voltage source and the second reference point comprises using a value of a first counter to turn on selected ones of a plurality of switching devices connected between the first voltage source and the second reference point.

6. A method for establishing buffer impedance values comprising:
    establishing a first buffer impedance value by automatically adjusting a first impedance between a first voltage source and a first reference point until the potential at the first reference point has a predetermined relationship to a reference voltage;
    establishing a second buffer impedance value by adjusting the impedance between a second reference point and a second voltage source, until the potential at the second reference point has a predetermined relationship with the reference voltage; and
    detecting a mode setting corresponding to a protocol and selecting the first voltage source according to the protocol.

7. The method of claim 6, further comprising sensing the mode setting in a translation logic and translating buffer input signals according to the protocol.

8. The method of claim 1, further comprising applying the established first and second buffer impedance values to a plurality of buffers.

9. The method of claim 1, further comprising setting the impedance between the first reference point and the second voltage source so that the voltage at the first reference point will have a predetermined relationship with the reference voltage when the first impedance has a predetermined relationship with the first buffer impedance value.

10. An electronic circuit comprising:
    a first impedance programmable device connected between a first voltage source and a first reference point;
    a second impedance programmable device connected between a second voltage source and a second reference point; and control logic for:
   establishing a first buffer impedance value by adjusting the impedance of the first impedance programmable device until the potential at the first reference point has a predetermined relationship with a reference voltage;
   setting an impedance between the first voltage source and the second reference point to a value based upon the first buffer impedance value; and
   establishing a second buffer impedance value by adjusting the impedance of the second impedance programmable device until the potential at the second reference point has a predetermined relationship with the reference voltage.

11. An electronic circuit comprising:
a first impedance programmable device connected between a first voltage source and a first reference point;
a second impedance programmable device connected between a second voltage source and a second reference point; and
control logic for:
   establishing a first buffer impedance value by adjusting the impedance of the first impedance programmable device until the potential at the first reference point has a predetermined relationship with a reference voltage;
   establishing a second buffer impedance value by adjusting the impedance of the second impedance programmable device until the potential at the second reference point has a predetermined relationship with the reference voltage;
a third impedance programmable device connected between the first voltage source and a second reference point; and
control logic for setting the impedance of the third impedance programmable device to equal the impedance of the first impedance programmable device.

12. The circuit of claim 10, further comprising a resistive load connected between the first reference point and the second voltage source.

13. The circuit of claim 11, further comprising a register for holding values, said register being operatively connected to the first and third impedance programmable devices to set their impedances according to the values in the register.

14. The circuit of claim 10, wherein the first impedance programmable device comprises a plurality of electronic switches arrayed in parallel between the first voltage source and the first reference point.

15. The circuit of claim 14, wherein the plurality of electronic switches have operating impedances that relate to each other by approximately powers of 2.

16. The circuit of claim 10, further comprising a plurality of programmable buffers operatively connected to receive from the control logic the first impedance programming value and the second impedance programming value and to establish impedances between their respective outputs and the first and second voltage sources according to the first and second impedance programming values, respectively.

17. The circuit of claim 16, further comprising
   a data bus operatively connected to transmit logic signals from at least one of the plurality of programmable buffers to other circuits.

18. The circuit of claim 10, wherein the first impedance programmable device, the second impedance programmable device, and the control logic comprise an integrated circuit.

19. The circuit of claim 11, further comprising a fourth impedance programmable device connected between the first reference point and the second voltage source.

20. A circuit comprising:
means for establishing a first buffer impedance value by electronically adjusting a first impedance between a first voltage source and a first reference point until the potential at the first reference point has a predetermined relationship with a reference voltage;
means for adjusting an impedance between the first voltage source and a second reference point to a value based upon the first buffer impedance value; and
means for establishing a second buffer impedance value by adjusting the impedance between the second reference point and a second voltage source, until the potential at the second reference point has a predetermined relationship with the reference voltage.

\* \* \* \* \*

UNITED STATES PATENT AND TRADEMARK OFFICE
CERTIFICATE OF CORRECTION

PATENT NO. : 6,347,850 B1
DATED : February 19, 2002
INVENTOR(S) : Andrew M. Volk It is certified that error appears in the above-identified patent and that said Letters Patent is hereby corrected as shown below:

Drawings,
Please replace the former Figure 2 with the newly submitted Figure 2 amending "190" with -- 290 -- and "180" with -- 280 --.

Column 2,
Line 67, please change "190" to -- 290 --.

Column 3,
Line 2, please change "180" to -- 280 --.

Signed and Sealed this

Eighth Day of June, 2004

JON W. DUDAS
*Acting Director of the United States Patent and Trademark Office*